US012302044B2

(12) United States Patent
Zhuang et al.

(10) Patent No.: US 12,302,044 B2
(45) Date of Patent: May 13, 2025

(54) SUB-RACK FOR CONVERTING COOLING PATTERN OF SIDE-TO-SIDE COOLED EQUIPMENT

(71) Applicant: Telefonaktiebolaget LM Ericsson (PUBL), Stockholm (SE)

(72) Inventors: Xiaofei Zhuang, Beijing (CN); Xiu Shi, Beijing (CN); Kai Huang, Beijing (CN)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 199 days.

(21) Appl. No.: 17/997,133

(22) PCT Filed: Apr. 29, 2020

(86) PCT No.: PCT/CN2020/087788
§ 371 (c)(1),
(2) Date: Oct. 26, 2022

(87) PCT Pub. No.: WO2021/217500
PCT Pub. Date: Nov. 4, 2021

(65) Prior Publication Data
US 2023/0353909 A1 Nov. 2, 2023

(51) Int. Cl.
*H05K 5/02* (2006.01)
*H04Q 1/02* (2006.01)
(Continued)

(52) U.S. Cl.
CPC ........... *H04Q 1/035* (2013.01); *H05K 5/0213* (2013.01); *H05K 5/03* (2013.01); *H05K 7/20145* (2013.01)

(58) Field of Classification Search
CPC .. H05K 5/035; H05K 5/0213; H05K 7/20145; H05Q 1/035
See application file for complete search history.

(56) References Cited

U.S. PATENT DOCUMENTS 6,717,807 B2 4/2004 Hikawa
7,256,992 B1 8/2007 Stewart et al.
(Continued)

FOREIGN PATENT DOCUMENTS

CN 101044808 A 9/2007
CN 101291574 A 10/2008
(Continued)

OTHER PUBLICATIONS

JP 2012204756 A English translation (Year: 2012).*
(Continued)

*Primary Examiner* — Mukundbhai G Patel
(74) *Attorney, Agent, or Firm* — Baker Botts L.L.P.

(57) ABSTRACT

A sub-rack for converting cooling pattern of a side-to-side cooled equipment is disclosed. According to an embodiment, the sub-rack comprises a first unit, a second cover disposed at a first lateral side of the first unit and a third cover disposed at a second lateral side of the first unit. The first unit comprises a first cover, a front side wall that is disposed at a front side of the first cover and has at least one inlet vent, a rear side wall that is disposed at a rear side of the first cover and has at least one outlet vent, and an air flow guiding member capable of guiding an air flow introduced from the at least one inlet vent to one of the first lateral side and the second lateral side of the first unit. The sub-rack further comprises. At least one cover of the second cover and the third cover is disposed to be movable relative to the first unit in a lateral direction via a first moving mechanism.

17 Claims, 5 Drawing Sheets

(51) Int. Cl.
*H05K 5/03* (2006.01)
*H05K 7/20* (2006.01)

(56) References Cited

U.S. PATENT DOCUMENTS

| | | | |
|---|---|---|---|
| 10,512,194 B1 * | 12/2019 | Marrs | ................ H05K 7/20727 |
| 2003/0214782 A1 | 11/2003 | Osborn et al. | |
| 2004/0007347 A1 | 6/2004 | Stoller | |
| 2004/0257766 A1 | 12/2004 | Rasmussen et al. | |
| 2005/0157467 A1 | 7/2005 | Malone et al. | |
| 2017/0023760 A1 | 1/2017 | Thijs et al. | |
| 2018/0242477 A1 | 8/2018 | Gupta et al. | |

FOREIGN PATENT DOCUMENTS

| | | | | |
|---|---|---|---|---|
| CN | 201897755 U | | 7/2011 | |
| JP | 2012204756 A | * | 10/2012 | ............... H05K 7/20 |

OTHER PUBLICATIONS

Office Action of the Intellectual Property Office issued for ROC (Taiwan) Patent Application No. 110106738—Oct. 29, 2021.
Extended European Search Report issued for Application No. / Patent No. 20933579.3-1201 / 4143829 PCT/CN2020087788—Dec. 11, 2023.
PCT Notification of Transmittal of International Preliminary Report on Patentability issued for International application No. PCT/CN2020/087788.
PCT Notification of Transmittal of the International Search Report and the Written Opinion of the International Searching Authority, or the Declaration issued for International application No. PCT/CN2020/087788—Jan. 28, 2021.

* cited by examiner

SUB-RACK FOR CONVERTING COOLING PATTERN OF SIDE-TO-SIDE COOLED EQUIPMENT

PRIORITY

This nonprovisional application is a U.S. National Stage Filing under 35 U.S.C. § 371 of International Patent Application Serial No. PCT/CN2020/087788 filed Apr. 29, 2020 and entitled "Sub-Rack For Converting Cooling Pattern of Side-to-Side Cooled Equipment" which is hereby incorporated by reference in its entirety.

TECHNICAL FIELD

Embodiments of the disclosure generally relate to cooling of electronic equipment, and, more particularly, to a sub-rack for converting cooling pattern of a side-to-side cooled equipment.

BACKGROUND

This section introduces aspects that may facilitate better understanding of the present disclosure. Accordingly, the statements of this section are to be read in this light and are not to be understood as admissions about what is in the prior art or what is not in the prior art.

Side-to-side air cooling is a cooling pattern widely used in many small and medium-sized shelves of telecommunication equipments. FIG. 1 is a perspective view of a typical side-to-side cooled equipment. As shown, the side-to-side cooled equipment 10 comprises a chassis 11, two fan trays 12, an air filter 13 and a plurality of boards (or cards) 14. The chassis 11 comprises a bottom wall 111, a top wall 112, a left side wall 113, a right side wall 114 and a back wall 115. Both the side walls 113, 114 are vented to allow cooling air to pass across the chassis. The fan trays 12 are inserted from the front side of the chassis 11 and close to one side wall 113. The fan trays 12 force air to be drawn in from the vent on one side wall 114 and exhausted from the vent on the other side wall 113 of the chassis 11. The air filter 13 is placed on the air inlet side of the chassis 11 to remove the particulate matter from cooling air. The boards 14 are assembled to the chassis 11 from the front side. The heat generated from the boards 14 can be taken away by the side-to-side air flow in the chassis 11. The air flow paths through each full card slot are parallel in this equipment.

Equipment with side-to-side cooling does not take chassis space for inlet and outlet regions. It is generally more compact. Thus, some equipment takes this airflow pattern for compact purpose. In another case, when equipment is designed with small depth, for example, some transportation equipment is designed to be fit in a 300 mm-depth cabinet, there is always lack of space in depth and the back wall of the cabinet is not perforated for ventilation. Then side-to-side airflow pattern becomes a good choice.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

One of the objects of the disclosure is to provide an improved sub-rack for converting cooling pattern of a side-to-side cooled equipment. In particular, one of the problems to be solved by the disclosure is to enhance the adaptability of the sub-rack to a cabinet into which the sub-rack is to be mounted.

According to a first aspect of the disclosure, there is provided a sub-rack for converting cooling pattern of a side-to-side cooled equipment. The sub-rack may comprise a first unit comprising a first cover, a front side wall that is disposed at a front side of the first cover and has at least one inlet vent, a rear side wall that is disposed at a rear side of the first cover and has at least one outlet vent, and an air flow guiding member capable of guiding an air flow introduced from the at least one inlet vent to one of a first lateral side and a second lateral side of the first unit. The sub-rack may further comprise a second cover disposed at the first lateral side of the first unit. The sub-rack may further comprise a third cover disposed at the second lateral side of the first unit. At least one cover of the second cover and the third cover may be disposed to be movable relative to the first unit in a lateral direction via a first moving mechanism.

In this way, the adaptability of the sub-rack to a cabinet into which the sub-rack is to be mounted can be improved while the cooling pattern of the side-to-side cooled equipment can be converted from side-to-side cooling pattern to front-to-back cooling pattern. Furthermore, since the sub-rack as a whole can be mounted into the cabinet (especially a 19-inch cabinet), the convenience of the mounting process can be improved.

In an embodiment of the disclosure, the sub-rack is able to be mounted into a cabinet where a lateral width of the cabinet behind installation pillars of the cabinet is greater than or equal to a minimum lateral width of the sub-rack. After the sub-rack has been mounted into the cabinet, the lateral width of the sub-rack is able to be adjusted freely according to the lateral width of the cabinet behind the installation pillars. Note that the term lateral width refers to the width in lateral direction.

In an embodiment of the disclosure, an amount of moving of the at least one cover relative to the first unit may be adjustable via a first adjusting mechanism.

In an embodiment of the disclosure, the sub-rack may further comprise a second unit opposing the first unit. The second unit may comprise a fourth cover, a front side wall that is disposed at a front side of the fourth cover and has at least one inlet vent, a rear side wall that is disposed at a rear side of the fourth cover and has at least one outlet vent, and an air flow guiding member capable of guiding an air flow introduced from the at least one inlet vent to the one of the first lateral side and the second lateral side of the second unit. The at least one cover may be disposed to be movable relative to the second unit in the lateral direction via a second moving mechanism.

In an embodiment of the disclosure, an amount of moving of the at least one cover relative to the second unit may be adjustable via a second adjusting mechanism.

In an embodiment of the disclosure, the first unit may be a bottom unit and the second unit is a top unit.

In an embodiment of the disclosure, the first unit may be a top unit and the second unit may be a bottom unit.

In an embodiment of the disclosure, the sub-rack may further comprise a back cover disposed at a rear side of the first unit.

In an embodiment of the disclosure, the air flow guiding member of the first unit may be a division plate that protrudes from the first cover towards the side-to-side cooled equipment to be mounted in the sub-rack and divides the first unit into two portions.

In an embodiment of the disclosure, the air flow guiding member of the second unit may be a division plate that protrudes from the fourth cover towards the side-to-side cooled equipment to be mounted in the sub-rack and divides the second unit into two portions.

In an embodiment of the disclosure, the first moving mechanism may comprise a first plate that protrudes from a first longitudinal end of the second cover towards the second lateral side of the second cover. The first moving mechanism may further comprise at least one first sliding block provided in one of the first plate and the first cover. The first moving mechanism may further comprise at least one first sliding slot provided in the other of the first plate and the first cover. The at least one first sliding block may be slidable along the at least one first sliding slot.

In an embodiment of the disclosure, the first moving mechanism may comprise a second plate that protrudes from a first longitudinal end of the third cover towards the first lateral side of the third cover. The first moving mechanism may further comprise at least one second sliding block provided in one of the second plate and the first cover. The first moving mechanism may further comprise at least one second sliding slot provided in the other of the second plate and the first cover. The at least one second sliding block may be slidable along the at least one second sliding slot.

In an embodiment of the disclosure, the second moving mechanism may comprise a third plate that protrudes from a second longitudinal end of the second cover towards the second lateral side of the second cover. The second moving mechanism may further comprise at least one third sliding block provided in one of the third plate and the fourth cover. The second moving mechanism may further comprise at least one third sliding slot provided in the other of the third plate and the fourth cover. The at least one third sliding block may be slidable along the at least one third sliding slot.

In an embodiment of the disclosure, the second moving mechanism may comprise a fourth plate that protrudes from a second longitudinal end of the third cover towards the first lateral side of the third cover. The second moving mechanism may further comprise at least one fourth sliding block provided in one of the fourth plate and the fourth cover. The second moving mechanism may further comprise at least one fourth sliding slot provided in the other of the fourth plate and the fourth cover. The at least one fourth sliding block may be slidable along the at least one fourth sliding slot.

In an embodiment of the disclosure, the first adjusting mechanism may comprise a front side wall that protrudes from a front side of the first plate towards the side-to-side cooled equipment to be mounted in the sub-rack and provided with a first locating hole. The first adjusting mechanism may further comprise a fifth sliding slot provided in the first lateral side of the front side wall of the first unit. The first adjusting mechanism may further comprise a first locating member that passes through the fifth sliding slot and the first locating hole and is slidable along the fifth sliding slot.

In an embodiment of the disclosure, the first adjusting mechanism may comprise a front side wall that protrudes from a front side of the second plate towards the side-to-side cooled equipment to be mounted in the sub-rack and provided with a second locating hole. The first adjusting mechanism may further comprise a sixth sliding slot provided in the second lateral side of the front side wall of the first unit. The first adjusting mechanism may further comprise a second locating member that passes through the sixth sliding slot and the second locating hole and is slidable along the sixth sliding slot.

In an embodiment of the disclosure, the second adjusting mechanism may comprise a front side wall that protrudes from a front side of the third plate towards the side-to-side cooled equipment to be mounted in the sub-rack and provided with a third locating hole. The second adjusting mechanism may further comprise a seventh sliding slot provided in the first lateral side of the front side wall of the second unit. The second adjusting mechanism may further comprise a third locating member that passes through the seventh sliding slot and the third locating hole and is slidable along the seventh sliding slot.

In an embodiment of the disclosure, the second adjusting mechanism may comprise a front side wall that protrudes from a front side of the fourth plate towards the side-to-side cooled equipment to be mounted in the sub-rack and provided with a fourth locating hole. The second adjusting mechanism may further comprise an eighth sliding slot provided in the second lateral side of the front side wall of the second unit. The second adjusting mechanism may further comprise a fourth locating member that passes through the eighth sliding slot and the fourth locating hole and is slidable along the eighth sliding slot.

In an embodiment of the disclosure, the side-to-side cooled equipment may be one of following equipments using side-to-side cooling pattern: a routing equipment; and a network equipment.

BRIEF DESCRIPTION OF THE DRAWINGS

These and other objects, features and advantages of the disclosure will become apparent from the following detailed description of illustrative embodiments thereof, which are to be read in connection with the accompanying drawings. Apparently, the schematic structure diagrams in the following drawings are not necessarily drawn to scale, but exhibit various features in a simplified form. Furthermore, the drawings in the following description relate merely to some embodiments of the disclosure, but should not be construed as limiting the disclosure.

DETAILED DESCRIPTION

For the purpose of explanation, details are set forth in the following description in order to provide a thorough understanding of the embodiments disclosed. It is apparent, however, to those skilled in the art that the embodiments may be implemented without these specific details or with an equivalent arrangement.

Besides side-to-side cooling mentioned above, front-to-back cooling is another cooling pattern commonly used in telecommunication equipments. Front-to-back air cooling has been granted as the preferred airflow pattern for telecommunication equipments and been recommended in couples of international and enterprise standards.

Although side-to-side airflow pattern has some benefits and has gotten widely application in certain kinds of electronic equipment, it has some disadvantages. Firstly, almost all the cabinets supply cool air on the front side, and exhaust hot air on the back or top side. Therefore, when mounting a side-to-side cooled equipment in a cabinet, the airflow patterns of the equipment and the cabinet are incompatible with each other. In this case, the equipment with side-to-side airflow pattern can receive little cool air that the cabinet supplies. Instead, it will draw in more hot air exhausted from adjacent equipment in the same cabinet. As a result, the side-to-side cooled equipment will work at higher operating temperature and may get insufficient cooling. It further results in reduced life time, unreliable performance, or even over-temperature shutdown. Secondly, side-to-side cooling is not the favorable airflow pattern in many international or enterprise standards. It may meet some hindrance when getting certificated or granted by them. For example, network equipment-building system (NEBS) has imposed punishment on equipment which is not front air inlet. NEBS has requested in "GR-63-Core" that equipment with all other air-inlet locations than front will go through the environmental test at maximum operating temperature 10 degrees centigrade higher. It means if a side-to-side cooled equipment (belonging to the scope of non-front air inlet) wants to get NEBS approval and declare the maximum operating temperature of 55 degrees centigrade, it has to pass the environmental test at 65 degrees centigrade. The third and most important, some customers begin to set mandatory requirement on the cooling pattern of purchased equipment such that the side-to-side cooled equipment will be excluded from their purchase.

To meet the requirement from international standards and cater to the needs of customers, some supplementary devices for side-to-side cooled equipment have been developed. The devices can be used together with a side-to-side cooled equipment in cabinet application and help convert the cooling pattern of the equipment to front-to-back pattern.

Figure 1:
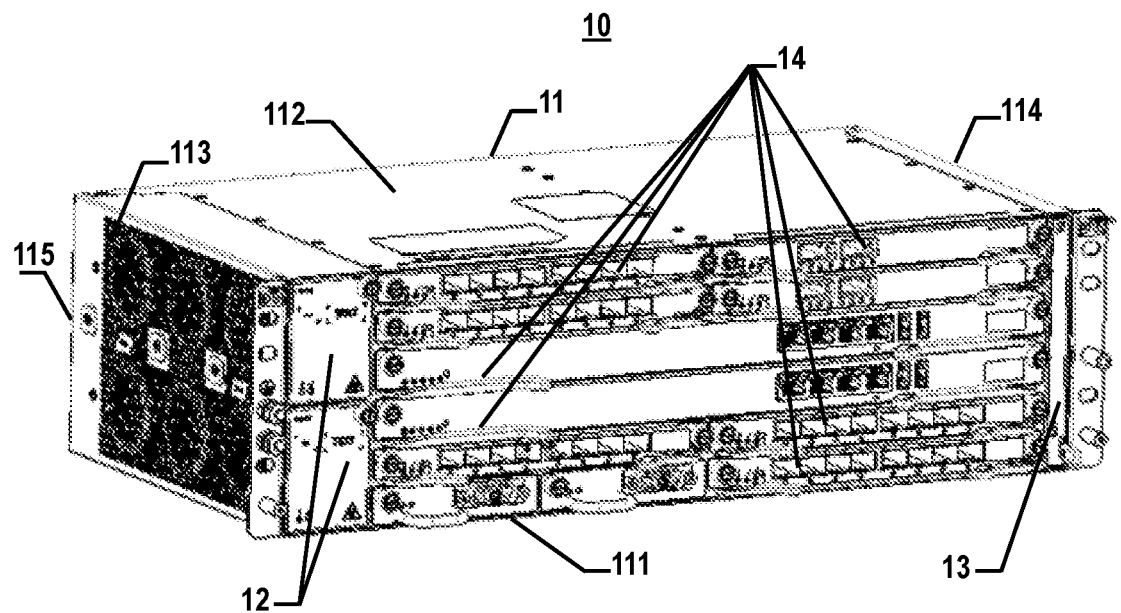
FIG. 1 is a perspective view of a typical side-to-side cooled equipment.
Figure 2:
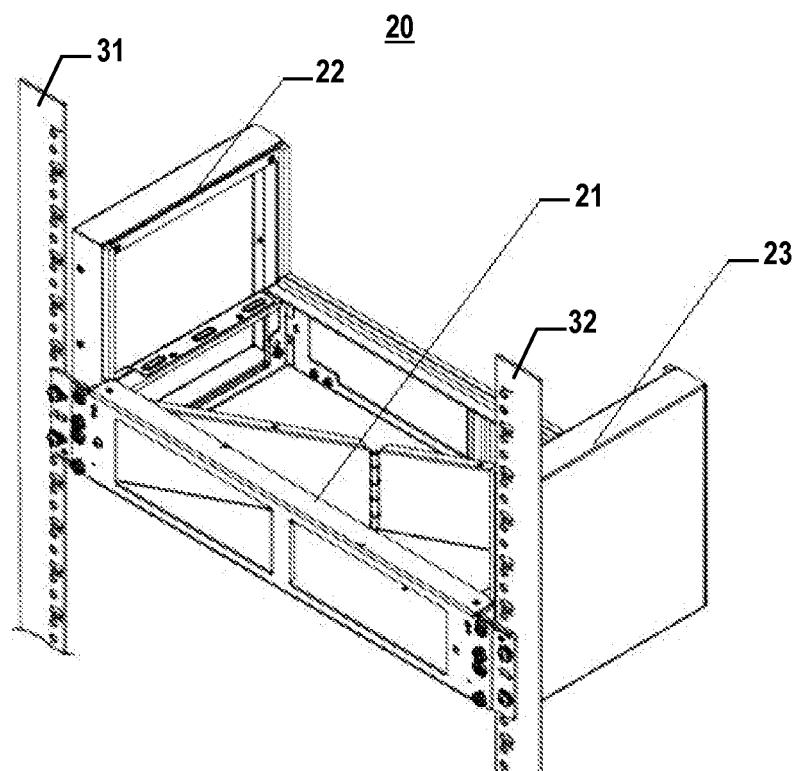
FIG. 2 is a perspective view of an existing plenum assembly.

FIG. 2 is a perspective view of an existing plenum assembly for converting the air flow pattern of a side-to-side cooled equipment. As shown, the plenum assembly 20 mainly comprises three parts: one plenum base 21 on the bottom and two air baffles 22 and 23 on two lateral sides. The three parts will be assembled, on site, to the two installation pillars 31 and 32 of the cabinet with screws and with support of two side plates.

Figure 3:
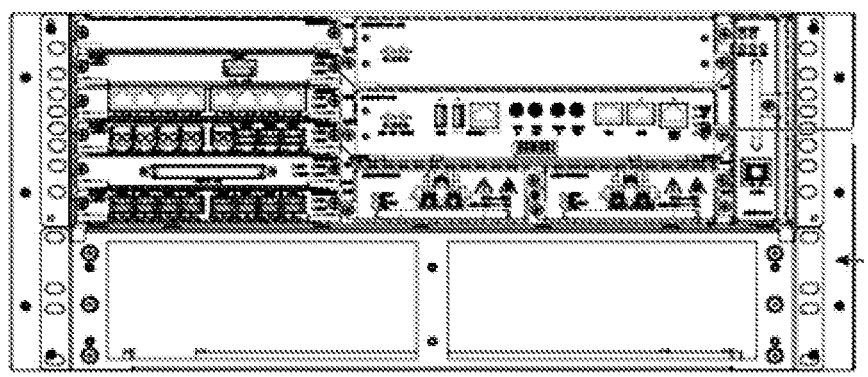
FIG. 3 is a front view of the existing plenum assembly with a side-to-side cooled equipment mounted therein.

FIG. 3 shows the air plenum assembly assembled together with a side-to-side cooled equipment. Cooling air can be supplied from the front bottom side of the plenum assembly, flow upward to the right side of the assembly, then flow across the equipment, then turn down in the left side of the assembly, and be exhausted from the back side of the plenum base. As a result, the plenum assembly 20 can convert the air flow pattern of a specific equipment from side-to-side to front-to-back.

The existing plenum assembly has the following disadvantages. Firstly, the plenum assembly will take 2U additional height to accommodate a 3U height equipment, where the U following the numbers "2" and "3" is short for unit and the number indicates the size of the rackmount. Secondly, the plenum assembly is composed of several discrete parts which will be assembled on site. This adds cost of material management and makes on-site installation complex. Thirdly, the space between the air baffles on both lateral sides has a fixed dimension. However, the space behind the two installation pillars varies much for different cabinets. Some are wide while some are narrow. Thus, the air baffles with a fixed dimension therebetween may result in that the plenum assembly can be fit in less types of cabinets.

The present disclosure proposes an improved sub-rack for converting cooling pattern of a side-to-side cooled equipment. Hereinafter, the sub-rack will be described in detail with reference to FIGS. 4-8.

Figure 4:
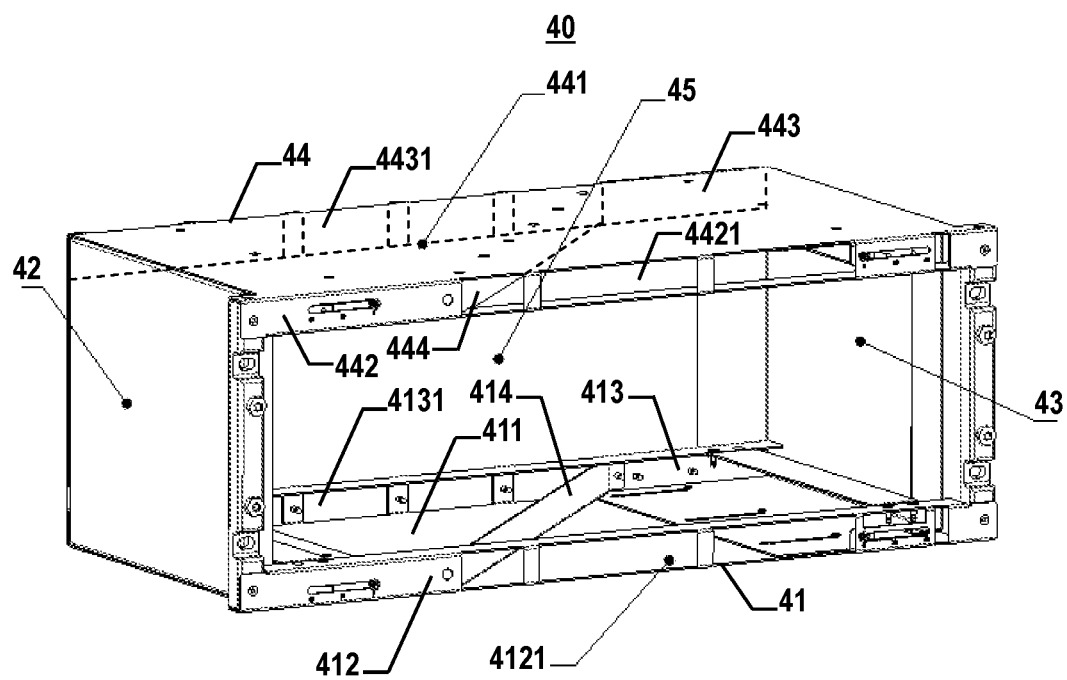
FIG. 4 is a perspective view of a sub-rack according to an embodiment of the disclosure.

FIG. 4 is a perspective view of a sub-rack for converting cooling pattern of a side-to-side cooled equipment according to an embodiment of the disclosure. As shown, the sub-rack 40 comprises a bottom unit 41, a left cover 42 disposed at a left side of the bottom unit 41, a right cover 43 disposed at a right side of the bottom unit 41, a top unit 44 opposing the bottom unit 41, and a back cover 45 disposed at a rear side of the bottom unit 41.

The bottom unit 41 comprises a bottom cover 411, a front side wall 412 that is disposed at a front side of the bottom cover 411 and has at least one inlet vent 4121, a rear side wall 413 that is disposed at a rear side of the bottom cover 411 and has at least one outlet vent 4131, and a division plate 414 that protrudes upwards from the bottom cover 411 and divides the bottom unit 41 into two portions. One portion (the right portion in the example of FIG. 4) corresponds to air intake and may be called as air inlet cavity. The other portion (the left portion in the example of FIG. 4) corresponds to air outtake and may be called as air outlet cavity. As shown, the division plate 414 is disposed along the diagonal direction of the bottom cover 411 and can guide an air flow introduced from the at least one inlet vent 4121 to the right side of the first unit 41.

The top unit 44 comprises a top cover 441, a front side wall 442 that is disposed at a front side of the top cover 441 and has at least one inlet vent 4421, a rear side wall 443 that is disposed at a rear side of the top cover 441 and has at least one outlet vent 4431, and a division plate 444 that protrudes downwards from the top cover 441 and divides the top unit 44 into two portions. Similarly, one portion (the right portion in the example of FIG. 4) corresponds to air intake and may be called as air inlet cavity. The other portion (the left portion in the example of FIG. 4) corresponds to air outtake and may be called as air outlet cavity. As shown, the division plate 444 is disposed along the diagonal direction of the top cover 441 and can guide an air flow introduced from the at least one inlet vent 4421 to the right side of the top unit 44.

Figure 5:
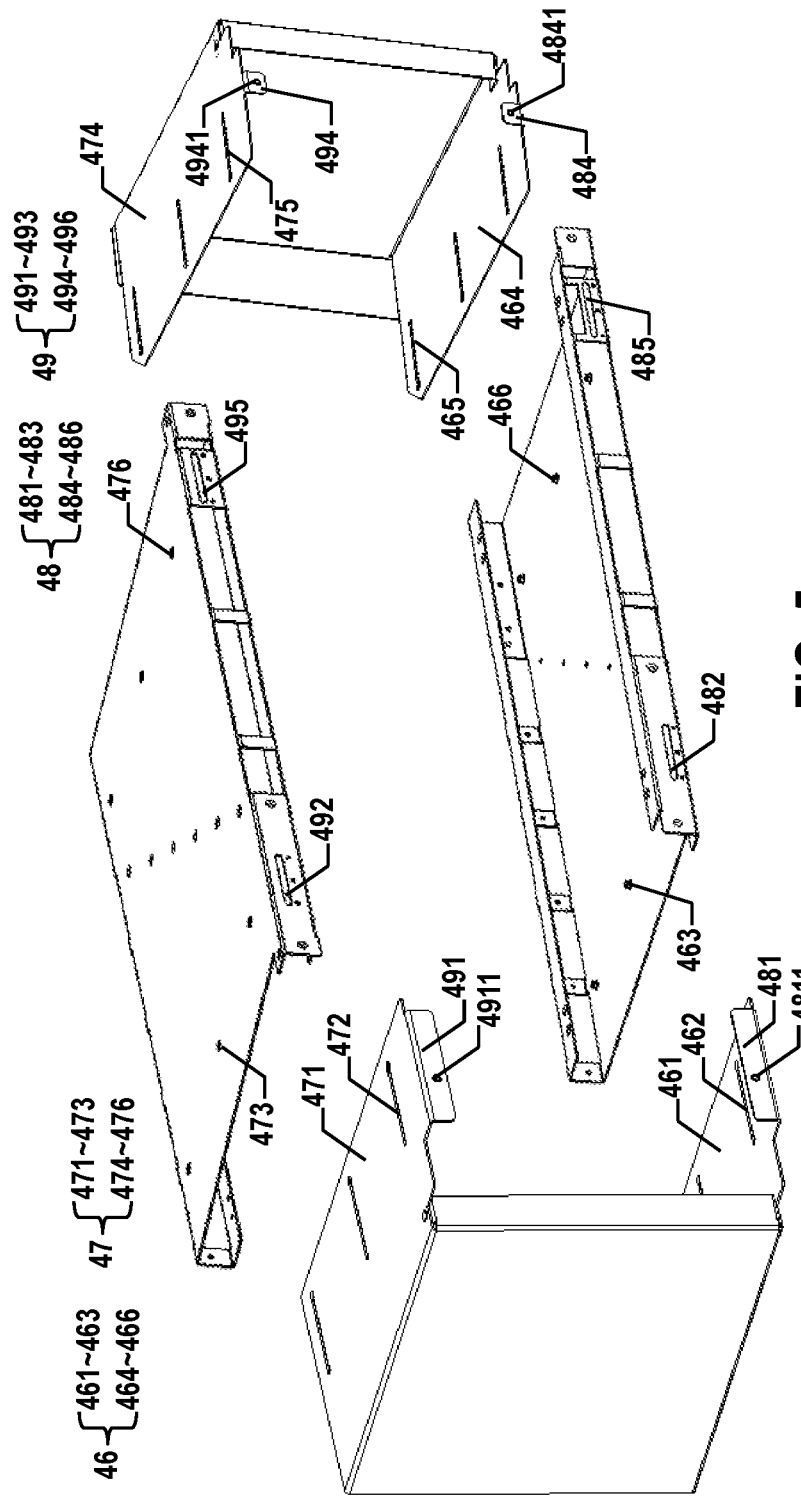
FIG. 5 is an exploded perspective view of the sub-rack according to the embodiment of the disclosure.

Each of the left cover 42 and the right cover 43 is disposed to be movable relative to the bottom unit 41 in a left-right direction via a moving mechanism 46. As shown in FIG. 5 which is an exploded perspective view of the sub-rack 40, the moving mechanism 46 comprises a plate 461 that protrudes from a bottom end of the left cover 42 towards a right side of the left cover 42, three sliding slots 462 provided in the plate 461, and three sliding blocks 463 provided in the bottom cover 411. The three sliding blocks 463 are slidable along the three sliding slots 462 respectively. Although T-shaped pins or keyhole standoffs are used as the sliding blocks in the example shown in FIG. 5, any other sliding blocks may be used instead. The moving mechanism 46 further comprises a plate 464 that protrudes from a bottom end of the right cover 43 towards a left side of the right cover 43, three sliding slots 465 provided in the plate 464, and three sliding blocks 466 provided in the bottom cover 411. The three sliding blocks 466 are slidable along the three sliding slots 465 respectively.

Furthermore, each of the left cover 42 and the right cover 43 is disposed to be movable relative to the top unit 44 in the left-right direction via a moving mechanism 47. As shown in FIG. 5, the moving mechanism 47 comprises a plate 471 that protrudes from a top end of the left cover 42 towards a right side of the left cover 42, three sliding slots 472 provided in the plate 471, and three sliding blocks 473 provided in the top cover 441. The three sliding blocks 473 are slidable along the three sliding slots 472 respectively. The moving mechanism 47 further comprises a plate 474 that protrudes from a top end of the right cover 43 towards a left side of the right cover 43, three sliding slots 475 provided in the plate 474, and three sliding blocks 476 provided in the top cover 441. The three sliding blocks 476 are slidable along the three sliding slots 475 respectively. Since Each of the left cover 42 and the right cover 43 is disposed to be movable relative to the bottom unit 41 and the top unit 44 in the left-right direction, the sub-rack 40 can fit for the application in most types of cabinets to which the sub-rack 40 is to be mounted, and can utilize the lateral space of the cabinet by the most.

Figure 6:
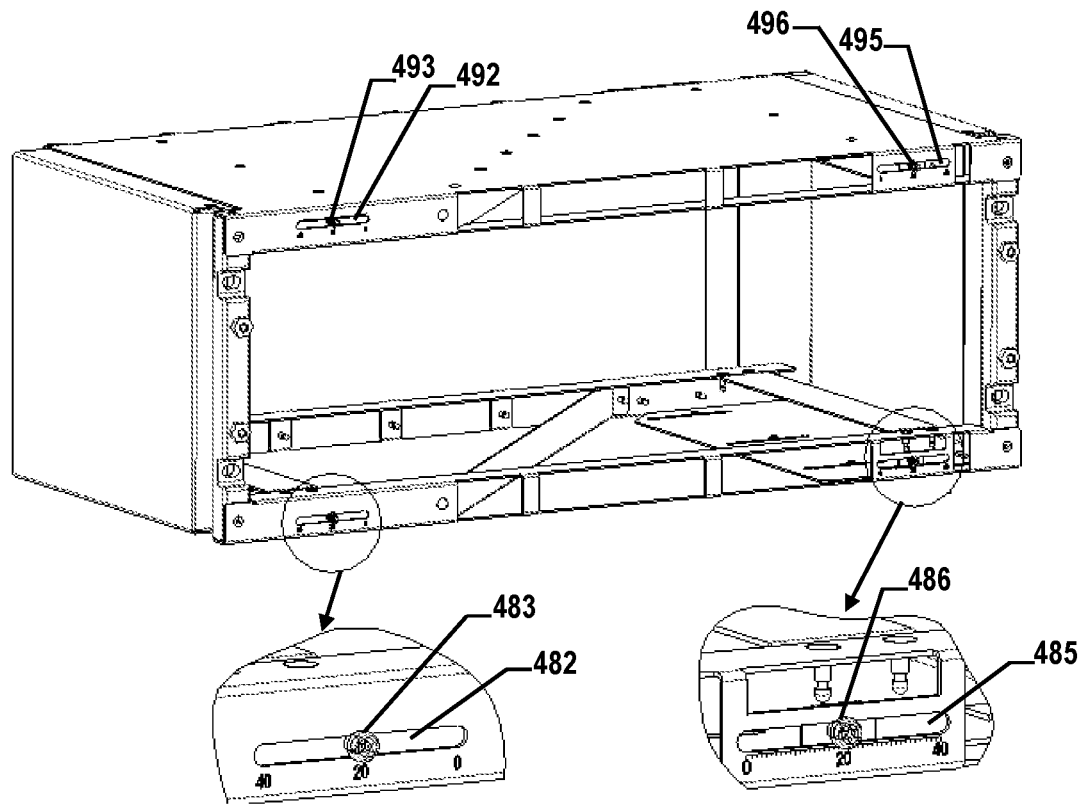
FIG. 6 is a partially enlarged view of the sub-rack according to the embodiment of the disclosure.

In addition, an amount of moving of each of the left cover 42 and the right cover 43 relative to the bottom unit 41 is adjustable via an adjusting mechanism 48. As shown in FIG. 5 and FIG. 6 which is a partially enlarged view of the sub-rack 40, the adjusting mechanism 48 comprises a front side wall 481 that protrudes upwards from a front side of the plate 461 and provided with a screw hole 4811, a sliding slot 482 provided in a left side of the front side wall 412 of the bottom unit 41, and a screw nut 483 that passes through the sliding slot 482 and the screw hole 4811 and is slidable along the sliding slot 482. When adjusting the moving amount of the left cover 42, the screw nut 483 can be loosened from the screw hole 4811 so that the left cover 42 is movable against the bottom unit 41 with screw nut 483 sliding in the sliding slot 482. After a desired moving amount has been reached, the screw nut 483 can be tightened into the screw hole 4811 so as to lock the left cover 42 against the bottom unit 41. The adjusting mechanism 48 further comprises a front side wall 484 that protrudes upwards from a front side of the plate 464 and provided with a screw hole 4841, a sliding slot 485 provided in a right side of the front side wall 412 of the bottom unit 41, and a screw nut 486 that passes through the sliding slot 485 and the screw hole 4841 and is slidable along the sliding slot 485.

Furthermore, the amount of moving of each of the left cover 42 and the right cover 43 relative to the top unit 44 is adjustable via an adjusting mechanism 49. As shown in FIG. 5 and FIG. 6, the adjusting mechanism 49 comprises a front side wall 491 that protrudes downwards from a front side of the plate 471 and provided with a screw hole 4911, a sliding slot 492 provided in a left side of the front side wall 442 of the top unit 44, and a screw nut 493 that passes through the sliding slot 492 and the screw hole 4911 and is slidable along the sliding slot 492. The adjusting mechanism 49 further comprises a front side wall 494 that protrudes downwards from a front side of the plate 474 and provided with a screw hole 4941, a sliding slot 495 provided in a right side of the front side wall 442 of the top unit 44, and a screw nut 496 that passes through the sliding slot 495 and the screw hole 4941 and is slidable along the sliding slot 495.

In the example of FIG. 6, the left cover 42 is adjusted by 20 mm to the left and the right cover 43 is adjusted by 20 mm to the right. The adjustment range of the left cover 42 is 0 to 40 mm, while the adjustment range of the right cover 43 is 0 to 40 mm. This means the adjustment range of air intake or outtake is 0 to 40 mm. Note that this example is merely for illustration purpose and any other adjustment range of air intake or outtake may be employed depending on the specific application scenario.

Figure 7:
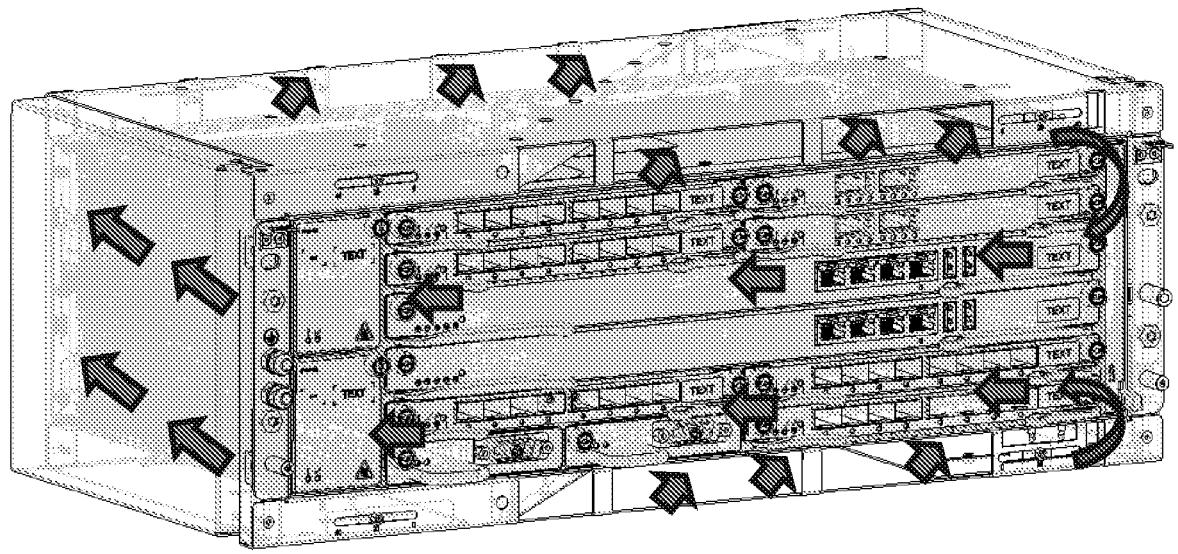
FIG. 7 is a perspective view of the sub-rack according to the embodiment with a side-to-side cooled equipment mounted therein.

FIG. 7 shows the sub-rack 40 with a typical side-to-side cooled equipment 10 mounted therein. Examples of the side-to-side cooled equipment 10 may include, but not limited to, a network equipment (e.g. a core network equipment), a routing equipment, etc. As shown by the arrows indicating air flow paths, cooling air can enter from the inlet vents 4121 and 4421, then turn up/down on the right side of the sub-rack 40, then flow across the equipment 10, then turn up/down/back on the left side of the sub-rack 40, and be finally exhausted from the outlet vents 4131 and 4431. In this way, the sub-rack 40 can convert the air flow pattern of the equipment 10 from side-to-side to front-to-back. Because two units (the bottom unit 41 and the top unit 44) are employed, the air flow can be made more uniform such that the system cooling can be made more efficient.

Figure 8A:
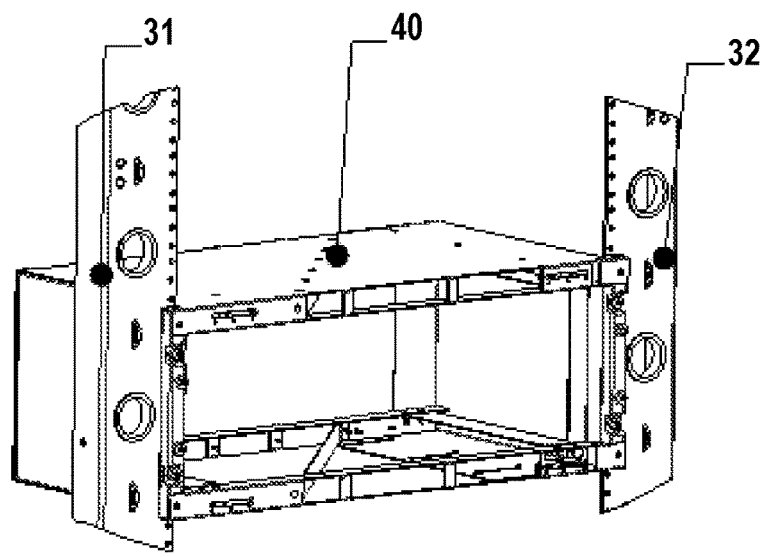
FIGS. 8A-8C are perspective views illustrating an exemplary installation process of the sub-rack according to the embodiment.
Figure 8B:
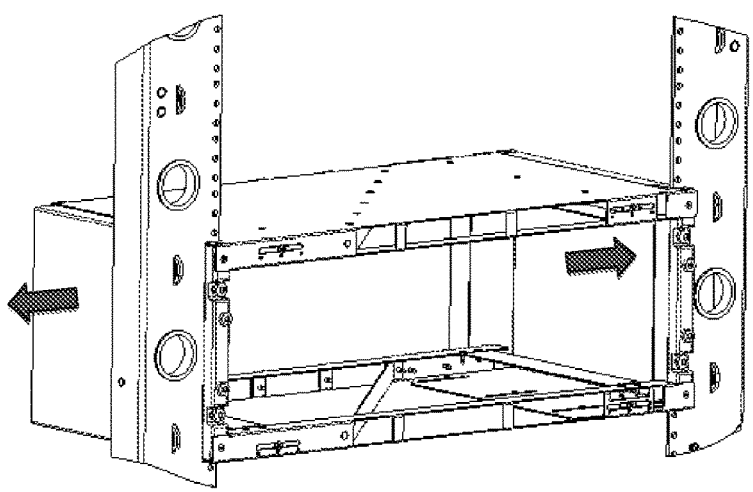
Figure 8C:
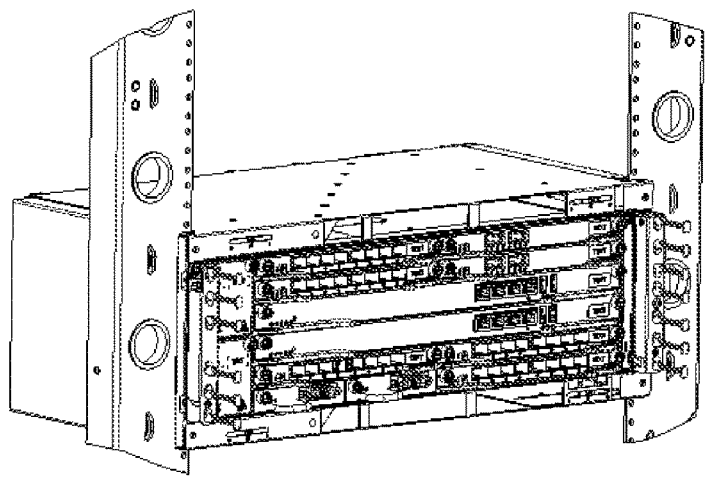

FIGS. 8A-8C are perspective views illustrating an exemplary installation process of the sub-rack according to the embodiment. In this process, the sub-rack 40 is installed into a 19-inch cabinet. For clarity, only the left installation pillar 31 and the right installation pillar 32 are shown to represent the cabinet. Correspondingly, the side-to-side cooled equipment to be accommodated in the sub-rack 40 is also fit for 19-inch cabinet installation. At a first step shown in FIG. 8A, the sub-rack 40 may be installed into the cabinet by the staff by, for example, using four M6 screws to secure the sub-rack 40 to the left and right pillars 31 and 32. At a second step shown in FIG. 8B, according to the size of the space between the left and right sides of the cabinet behind the installation pillars, the left cover of the sub-rack 40 may be pulled 20 mm or more to the left while the right cover of the sub-rack may be pulled 20 mm or more to the right. In this way, the sub-rack will not interfere with the equipment to be loaded into the 19-inch cabinet. At a third step shown in FIG. 8C, the side-to-side cooled equipment may be installed into the sub-rack 40 by, for example, using four M6 screws to secure the equipment to the sub-rack.

It should be noted that the present disclosure is not limited to the example described above. As another example, the division plate of the bottom unit or the top unit may be replaced by any other air flow guiding member (e.g. an elongated columnar body having a cross-section of a trapezoid or a triangle, etc.) capable of guiding an air flow introduced from the at least one inlet vent to one of a first lateral side and a second lateral side of the bottom unit or the top unit. The one of the first lateral side and the second lateral side may correspond to the inlet vent of the side-to-side cooled equipment that is to be mounted in the sub-rack. As yet another example, only one of the bottom unit and the top unit may be used instead. Correspondingly, only one of the moving mechanism 46 and the moving mechanism 47 may be used and only one of the adjusting mechanism 48 and the adjusting mechanism 49 may be used. As yet another example, both adjusting mechanisms 48 and 49 may be omitted at the expense of a certain loss of operational convenience. As yet another example, only one of the left cover and the right cover may be disposed to be movable relative to at least one of the bottom unit and the top unit in the left-right direction. As yet another example, the number of the sliding blocks and corresponding sliding slots provided on each lateral side of the moving mechanism(s) may be at least one. As yet another example, the screw hole and the screw nut provided in the adjusting mechanism(s) may be replaced with any other suitable locating hole and locating member (e.g. a handle, etc.). As yet another example, the moving of the left cover or the right cover is not limited to sliding and any other suitable moving manner may be used instead. For instance, the left cover or the right cover may be switched between a plurality of predetermined positions in the left-right direction.

Based on the above description, at least one aspect of the present disclosure provides a sub-rack for converting cooling pattern of a side-to-side cooled equipment. The sub-rack comprises a first unit (e.g. the bottom unit 41 or the top unit 44), a second cover (e.g. the left cover 42) disposed at a first lateral side (e.g. a left side) of the first unit, and a third cover (e.g. the right cover 43) disposed at a second lateral side (e.g. a right side) of the first unit. The first unit comprises a first cover (e.g. the bottom cover 41 or the top cover 44), a front side wall (e.g. the front side wall 412 or 442) that is disposed at a front side of the first cover and has at least one inlet vent (e.g. the inlet vent 4121 or 4421), a rear side wall (e.g. the rear side wall 413 or 443) that is disposed at a rear side of the first cover and has at least one outlet vent (e.g. the outlet vent 4131 or 4431), and an air flow guiding member (e.g. the division plate 414 or 444) capable of guiding an air flow introduced from the at least one inlet vent to one of a first lateral side and a second lateral side of the first unit. At least one cover of the second cover and the third cover is disposed to be movable relative to the first unit in a lateral direction via a first moving mechanism (e.g. the moving mechanism 46 or 47).

Since at least one cover of the second cover and the third cover is disposed to be movable relative to the first unit in a lateral direction, the sub-rack can be mounted into a cabinet as long as a lateral width of the cabinet behind installation pillars of the cabinet is greater than or equal to a minimum lateral width of the sub-rack. After the sub-rack has been mounted into the cabinet, the lateral width of the sub-rack is able to be adjusted freely according to the lateral width of the cabinet behind the installation pillars.

In an embodiment, an amount of moving of the at least one cover relative to the first unit is adjustable via a first adjusting mechanism (e.g. the adjusting mechanism 48 or 49).

In an embodiment, the sub-rack further comprises a second unit (e.g. the top unit 44 or the bottom unit 41) opposing the first unit (e.g. the bottom unit 41 or the top unit 44). This means that when the first unit is the bottom unit 41, the second unit is the top unit 44. On the other hand, when the first unit is the top unit 44, the second unit is the bottom unit 41. The second unit comprises a fourth cover (e.g. the top cover 441 or the bottom cover 411), a front side wall (e.g. the front side wall 442 or 412) that is disposed at a front side of the fourth cover and has at least one inlet vent (e.g. the inlet vent 4421 or 4121), a rear side wall (e.g. the rear side wall 443 or 413) that is disposed at a rear side of the fourth cover and has at least one outlet vent (e.g. the outlet vent 4431 or 4131), and an air flow guiding member (e.g. the division plate 444 or 414) capable of guiding an air flow introduced from the at least one inlet vent to the one of the first lateral side and the second lateral side of the second unit. The at least one cover is disposed to be movable relative to the second unit in the lateral direction via a second moving mechanism (e.g. the moving mechanism 47 or 46).

In an embodiment, an amount of moving of the at least one cover relative to the second unit is adjustable via a second adjusting mechanism (e.g. the adjusting mechanism 49 or 48).

In an embodiment, the sub-rack further comprises a back cover disposed at a rear side of the first unit.

In an embodiment, the first moving mechanism (e.g. the moving mechanism 46 or 47) comprises: a first plate (e.g. the plate 461 or 471) that protrudes from a first longitudinal end (e.g. the bottom end or the top end) of the second cover towards the second lateral side of the second cover, at least one first sliding block (e.g. the sliding block 463 or 473) provided in one of the first plate and the first cover, and at least one first sliding slot (e.g. the sliding slot 462 or 472) provided in the other of the first plate and the first cover. At least one first sliding block is slidable along the at least one first sliding slot.

In an embodiment, the first moving mechanism (e.g. the moving mechanism 46 or 47) comprises: a second plate (e.g. the plate 464 or 474) that protrudes from a first longitudinal end (e.g. the bottom end or the top end) of the third cover towards the first lateral side of the third cover, at least one second sliding block (e.g. the sliding block 466 or 476) provided in one of the second plate and the first cover, and at least one second sliding slot (e.g. the sliding slot 465 or 475) provided in the other of the second plate and the first cover. The at least one second sliding block is slidable along the at least one second sliding slot.

In an embodiment, the second moving mechanism (e.g. the moving mechanism 47 or 46) comprises: a third plate (e.g. the plate 471 or 461) that protrudes from a second longitudinal end (e.g. the top end or the bottom end) of the second cover towards the second lateral side of the second cover, at least one third sliding block (e.g. the sliding block 473 or 463) provided in one of the third plate and the fourth cover, and at least one third sliding slot (e.g. the sliding slot 472 or 462) provided in the other of the third plate and the fourth cover, wherein the at least one third sliding block is slidable along the at least one third sliding slot.

In an embodiment, the second moving mechanism (e.g. the moving mechanism 47 or 46) comprises: a fourth plate (e.g. the plate 474 or 464) that protrudes from a second longitudinal end (e.g. the top end or the bottom end) of the third cover towards the first lateral side of the third cover, at least one fourth sliding block (e.g. the sliding block 476 or 466) provided in one of the fourth plate and the fourth cover, and at least one fourth sliding slot (e.g. the sliding slot 475 or 465) provided in the other of the fourth plate and the fourth cover, wherein the at least one fourth sliding block is slidable along the at least one fourth sliding slot.

In an embodiment, the first adjusting mechanism (e.g. the adjusting mechanism 48 or 49) comprises: a front side wall (e.g. the front side wall 481 or 491) that protrudes from a front side of the first plate towards the side-to-side cooled equipment to be mounted in the sub-rack and provided with a first locating hole (e.g. the screw hole 4811 or 4911), a fifth sliding slot (e.g. the sliding slot 482 or 492) provided in the first lateral side of the front side wall of the first unit, and a first locating member (e.g. the screw nut 483 or 493) that passes through the fifth sliding slot and the first locating hole and is slidable along the fifth sliding slot.

In an embodiment, the first adjusting mechanism (e.g. the adjusting mechanism 48 or 49) comprises: a front side wall (e.g. the front side wall 484 or 494) that protrudes from a front side of the second plate towards the side-to-side cooled equipment to be mounted in the sub-rack and provided with a second locating hole (e.g. the screw hole 4841 or 4941), a sixth sliding slot (e.g. the sliding slot 485 or 495) provided in the second lateral side of the front side wall of the first unit, and a second locating member (e.g. the screw nut 486 or 496) that passes through the sixth sliding slot and the second locating hole and is slidable along the sixth sliding slot.

In an embodiment, the second adjusting mechanism (e.g. the adjusting mechanism 49 or 48) comprises: a front side wall (e.g. the front side wall 491 or 481) that protrudes from a front side of the third plate towards the side-to-side cooled equipment to be mounted in the sub-rack and provided with a third locating hole (e.g. the screw hole 4911 or 4811), a seventh sliding slot (e.g. the sliding slot 492 or 482) provided in the first lateral side of the front side wall of the second unit, and a third locating member (e.g. the screw nut 493 or 483) that passes through the seventh sliding slot and the third locating hole and is slidable along the seventh sliding slot.

In an embodiment, the second adjusting mechanism (e.g. the adjusting mechanism 49 or 48) comprises: a front side wall (e.g. the front side wall 494 or 484) that protrudes from a front side of the fourth plate towards the side-to-side cooled equipment to be mounted in the sub-rack and provided with a fourth locating hole (e.g. the screw hole 4941 or 4841), an eighth sliding slot (e.g. the sliding slot 495 or 485) provided in the second lateral side of the front side wall of the second unit, and a fourth locating member (e.g. the screw nut 496 or 486) that passes through the eighth sliding slot and the fourth locating hole and is slidable along the eighth sliding slot.

Unless otherwise defined, all terms used herein (including technical and scientific terms) have the same meaning as commonly understood by those skilled in the art. It should be further understood that terms, such as those defined in commonly used dictionaries, should be interpreted as having a meaning that is consistent with their meaning in the context of the specification and the relevant art and should not be interpreted in an ideal or excessively formal sense unless clearly defined in the present disclosure.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components, but do not preclude the presence or addition of one or more other features, elements, components and/or combinations thereof. As used herein, the statement that two or more parts are "coupled", "connected" or "cascaded" together shall mean that the parts are joined together either directly or joined through one or more intermediate parts.

It should be understood that, although the terms "first", "second" and so on may be used herein to describe various elements, these elements should not be limited by these terms. These terms are only used to distinguish one element from another. For example, a first element could be termed a second element, and similarly, a second element could be termed a first element, without departing from the scope of the disclosure. As used herein, the term "and/or" includes any and all combinations of one or more of the associated listed terms.

References in the present disclosure to "one embodiment", "an embodiment" and so on, indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

It is to be understood that the orientation or position relationships indicated by the terms such as "top", "bottom", "left", "right", etc. are the orientation or position relationships based on the drawings, which are only used to facilitate the description of the present disclosure or simplify the description, and are not intended to indicate or suggest that the members, components or apparatuses should have the specific orientations, or should be manufactured and operated in the specific orientations. Therefore, the terms should not be construed as limiting the present disclosure.

As used herein, the term "examples" particularly when followed by a listing of terms is merely exemplary and illustrative, and should not be deemed to be exclusive. It should be noted that various aspects of the present disclosure may be implemented individually or in combination with one or more other aspects. Furthermore, the detailed description and specific embodiments are intended for purposes of illustration only and are not intended to limit the scope of the disclosure.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-limiting and exemplary embodiments of this disclosure.

What is claimed is:

1. A sub-rack for converting cooling pattern of a side-to-side cooled equipment, comprising:
   a first unit comprising a first cover, a front side wall that is disposed at a front side of the first cover and has at least one inlet vent, a rear side wall that is disposed at a rear side of the first cover and has at least one outlet vent, and an air flow guiding member comprising a division plate that protrudes from the first cover towards the side-to-side cooled equipment to be mounted in the sub-rack and divides the first unit into a first portion and a second portion, wherein the at least one outlet vent of the first unit is proximate the first portion and the at least one outlet vent of the first unit is proximate the second portion, and wherein the air flow guiding member operates to guide an air flow introduced from the at least one inlet vent of the front side wall to one of a first lateral side and a second lateral side of the first unit before exiting the at least one outlet vent of the rear side wall;
   a second cover disposed at the first lateral side of the first unit; and
   a third cover disposed at the second lateral side of the first unit;
   wherein at least one cover of the second cover and the third cover is disposed to be movable relative to the first unit in a lateral direction via a first moving mechanism.

2. The sub-rack according to claim 1, wherein the sub-rack is able to be mounted into a cabinet where a lateral width of the cabinet behind installation pillars of the cabinet is greater than or equal to a minimum lateral width of the sub-rack; and wherein after the sub-rack has been mounted into the cabinet, the lateral width of the sub-rack is able to be adjusted freely according to the lateral width of the cabinet behind the installation pillars.

3. The sub-rack according to claim 1, wherein an amount of moving of the at least one cover relative to the first unit is adjustable via a first adjusting mechanism.

4. The sub-rack according to claim 1, further comprising:
a second unit opposing the first unit, the second unit comprising a fourth cover, a front side wall that is disposed at a front side of the fourth cover and has at least one inlet vent, a rear side wall that is disposed at a rear side of the fourth cover and has at least one outlet vent, and an air flow guiding member capable of guiding an air flow introduced from the at least one inlet vent to the one of the first lateral side and the second lateral side of the second unit; and
wherein the at least one cover is disposed to be movable relative to the second unit in the lateral direction via a second moving mechanism.

5. The sub-rack according to claim 4, wherein an amount of moving of the at least one cover relative to the second unit is adjustable via a second adjusting mechanism.

6. The sub-rack according to claim 4, wherein the first unit is a bottom unit and the second unit is a top unit; or
wherein the first unit is a top unit and the second unit is a bottom unit.

7. The sub-rack according to claim 4, wherein the air flow guiding member of the second unit is a division plate that protrudes from the fourth cover towards the side-to-side cooled equipment to be mounted in the sub-rack and divides the second unit into two portions.

8. The sub-rack according to claim 4, wherein the second moving mechanism comprises:
a third plate that protrudes from a second longitudinal end of the second cover towards the second lateral side of the second cover;
at least one third sliding block provided in one of the third plate and the fourth cover; and
at least one third sliding slot provided in the other of the third plate and the fourth cover, wherein the at least one third sliding block is slidable along the at least one third sliding slot.

9. The sub-rack according to claim 8, wherein the second adjusting mechanism comprises:
a front side wall that protrudes from a front side of the third plate towards the side-to-side cooled equipment to be mounted in the sub-rack and provided with a third locating hole;
a seventh sliding slot provided in the first lateral side of the front side wall of the second unit; and
a third locating member that passes through the seventh sliding slot and the third locating hole and is slidable along the seventh sliding slot.

10. The sub-rack according to claim 4, wherein the second moving mechanism comprises:
a fourth plate that protrudes from a second longitudinal end of the third cover towards the first lateral side of the third cover;
at least one fourth sliding block provided in one of the fourth plate and the fourth cover; and
at least one fourth sliding slot provided in the other of the fourth plate and the fourth cover, wherein the at least one fourth sliding block is slidable along the at least one fourth sliding slot.

11. The sub-rack according to claim 10, wherein the second adjusting mechanism comprises:
a front side wall that protrudes from a front side of the fourth plate towards the side-to-side cooled equipment to be mounted in the sub-rack and provided with a fourth locating hole;
an eighth sliding slot provided in the second lateral side of the front side wall of the second unit; and
a fourth locating member that passes through the eighth sliding slot and the fourth locating hole and is slidable along the eighth sliding slot.

12. The sub-rack according to claim 1, further comprising:
a back cover disposed at a rear side of the first unit.

13. The sub-rack according to claim 1, wherein the first moving mechanism comprises:
a first plate that protrudes from a first longitudinal end of the second cover towards the second lateral side of the second cover;
at least one first sliding block provided in one of the first plate and the first cover; and
at least one first sliding slot provided in the other of the first plate and the first cover, wherein the at least one first sliding block is slidable along the at least one first sliding slot.

14. The sub-rack according to claim 13, wherein the first adjusting mechanism comprises:
a front side wall that protrudes from a front side of the first plate towards the side-to-side cooled equipment to be mounted in the sub-rack and provided with a first locating hole;
a fifth sliding slot provided in the first lateral side of the front side wall of the first unit; and
a first locating member that passes through the fifth sliding slot and the first locating hole and is slidable along the fifth sliding slot.

15. The sub-rack according to claim 1, wherein the first moving mechanism comprises:
a second plate that protrudes from a first longitudinal end of the third cover towards the first lateral side of the third cover;
at least one second sliding block provided in one of the second plate and the first cover; and
at least one second sliding slot provided in the other of the second plate and the first cover, wherein the at least one second sliding block is slidable along the at least one second sliding slot.

16. The sub-rack according to claim 15, wherein the first adjusting mechanism comprises:
a front side wall that protrudes from a front side of the second plate towards the side-to-side cooled equipment to be mounted in the sub-rack and provided with a second locating hole;
a sixth sliding slot provided in the second lateral side of the front side wall of the first unit; and
a second locating member that passes through the sixth sliding slot and the second locating hole and is slidable along the sixth sliding slot.

17. The sub-rack according to claim 1, wherein the side-to-side cooled equipment is one of following equipments using side-to-side cooling pattern:

a routing equipment; and
a network equipment.

\* \* \* \* \*